(12) United States Patent
Tsujiyama et al.

(10) Patent No.: US 11,508,545 B2
(45) Date of Patent: Nov. 22, 2022

(54) GRID ASSEMBLY AND ION BEAM ETCHING APPARATUS

(71) Applicant: CANON ANELVA CORPORATION, Kawasaki (JP)

(72) Inventors: Masashi Tsujiyama, Kawasaki (JP); Yasushi Yasumatsu, Kawasaki (JP); Kaori Motochi, Kawasaki (JP)

(73) Assignee: CANON ANELVA CORPORATION, Kawasakishi (JP)

(*) Notice: Subject to any disclaimer, the term of this patent is extended or adjusted under 35 U.S.C. 154(b) by 479 days.

(21) Appl. No.: 14/741,902

(22) Filed: Jun. 17, 2015

(65) Prior Publication Data

US 2015/0287567 A1  Oct. 8, 2015

Related U.S. Application Data

(63) Continuation of application No. PCT/JP2013/007267, filed on Dec. 10, 2013.

(30) Foreign Application Priority Data

Dec. 19, 2012 (JP) ............................. JP2012-277105

(51) Int. Cl.
*H01J 37/147* (2006.01)
*H01J 37/32* (2006.01)
(Continued)

(52) U.S. Cl.
CPC .......... *H01J 37/147* (2013.01); *H01J 27/024* (2013.01); *H01J 37/32357* (2013.01);
(Continued)

(58) Field of Classification Search
CPC ........ H01J 27/024; H01J 27/16; H01J 29/025; H01J 37/147; H01J 37/32357; H01J 37/32422; H01J 2229/482; H01J 2237/334
See application file for complete search history.

(56) References Cited

U.S. PATENT DOCUMENTS 4,749,912 A * 6/1988 Hara ........................ H01J 27/08
250/423 R
4,873,467 A * 10/1989 Kaufman ............... F03H 1/0043
313/268

(Continued)

FOREIGN PATENT DOCUMENTS

JP       4-329249 A     11/1992
JP       04329249 A  *  11/1992
(Continued)

OTHER PUBLICATIONS

Official Letter dated Jul. 23, 2015 issued in Taiwan Patent Application No. 102146657 (7 pages).

*Primary Examiner* — Benjamin Kendall
(74) *Attorney, Agent, or Firm* — Venable LLP

(57) ABSTRACT

An object of the invention is to provide a grid assembly which is easy to assemble and is high in assembly reproducibility, and an ion beam etching apparatus including it. A grid assembly is constructed of three grids each in the shape of a circular plate, which are stacked one on top of another. The grid assembly includes three fixing holes for fixing the three grids, and three positioning holes for positioning the three grids. In assembly, the three grids are stacked one on top of another on a first ring so that positioning pins provided on the first ring are inserted into the positioning holes. Then, a second ring is stacked on top of the three grids, and bolts are inserted into the fixing holes. Thus, positioning is performed by using the fixed positioning pins (Continued)

and thereafter the fixing can be performed, which facilitates the assembly.

9 Claims, 12 Drawing Sheets

(51) Int. Cl.
  *H01J 27/02* (2006.01)
  *H01J 27/16* (2006.01)
(52) U.S. Cl.
  CPC ......... *H01J 37/32422* (2013.01); *H01J 27/16* (2013.01); *H01J 2237/334* (2013.01)

(56) References Cited

U.S. PATENT DOCUMENTS

| | | | |
|---|---|---|---|
| 5,177,398 A | 1/1993 | Engemann | |
| 5,216,330 A | 6/1993 | Ahonen | |
| 5,420,415 A | 5/1995 | Trueira | |
| 6,590,324 B1* | 7/2003 | Kanarov | H01J 27/022 |
| | | | 313/299 |
| 7,675,042 B2 | 3/2010 | Frosien | |
| 8,378,576 B2 | 2/2013 | Abarra et al. | |
| 8,703,001 B1* | 4/2014 | Hegde | H01J 27/024 |
| | | | 216/59 |
| 2005/0211926 A1 | 9/2005 | Ito et al. | |
| 2007/0125954 A1* | 6/2007 | Frosien | H01J 9/18 |
| | | | 250/396 R |
| 2011/0139998 A1* | 6/2011 | Abarra | H01J 27/08 |
| | | | 250/423 R |
| 2011/0256642 A1* | 10/2011 | Matsui | B82Y 25/00 |
| | | | 438/3 |

FOREIGN PATENT DOCUMENTS

| | | |
|---|---|---|
| JP | 8-167397 A | 6/1996 |
| JP | 2000-49144 A | 2/2000 |
| JP | 2004-207148 A | 7/2004 |
| JP | 2005-276790 A | 10/2005 |
| JP | 2007-510263 A | 4/2007 |
| JP | 2011-129270 A | 6/2011 |
| JP | 2013-114894 A | 6/2013 |
| TW | 278209 B | 6/1996 |

\* cited by examiner

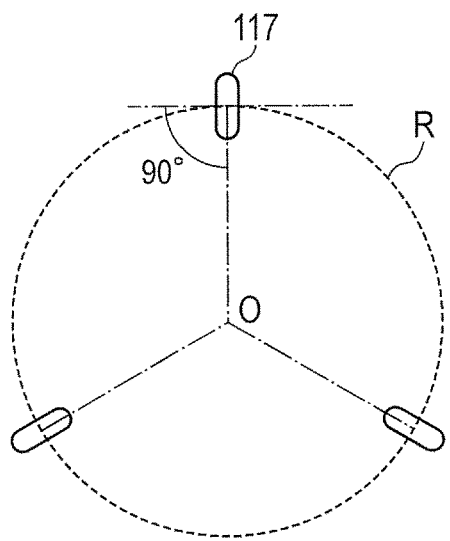
FIG. 7A
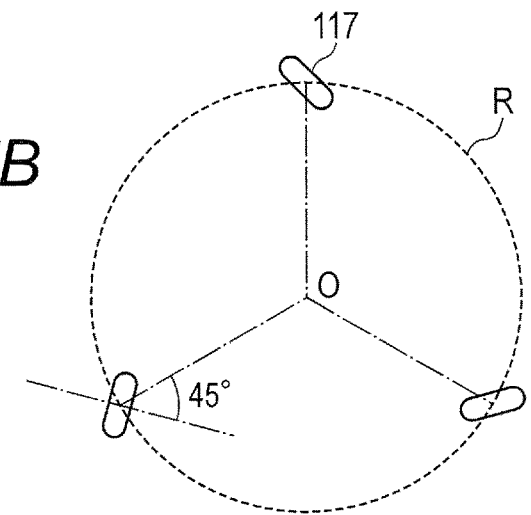
FIG. 7B
FIG. 8
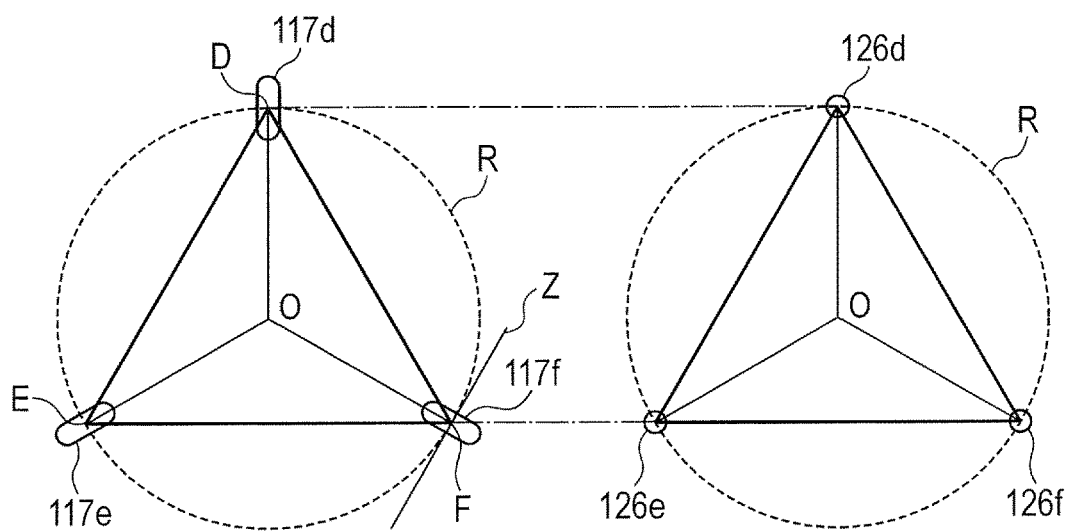

GRID ASSEMBLY AND ION BEAM ETCHING APPARATUS

CROSS-REFERENCE TO RELATED APPLICATIONS

This application is a continuation application of International Application No. PCT/JP2013/007267, filed Dec. 10, 2013, which claims the benefit of Japanese Patent Application No. 2012-277105 filed Dec. 19, 2012. The contents of the aforementioned applications are incorporated herein by reference in their entireties.

TECHNICAL FIELD

The present invention relates to a grid assembly and an ion beam etching apparatus including the grid assembly.

BACKGROUND ART

In a technology for manufacturing a semiconductor device, an ion beam etching (hereinafter, also called IBE) process is used to form various patterns on a process object such as a substrate. An IBE apparatus for executing the IBE process introduces gas into an ion source, generates plasma by using an appropriate means, and extracts ions from the plasma. The IBE process is performed by irradiating the process object with the extracted ion beam.

Heretofore, the IBE apparatus has adopted a configuration such that plural grids are used to extract ions from plasma. In one form of the IBE apparatus, the plural grids are fixed at their ends to form a grid assembly. FIG. 13A is a plan view of a grid assembly in a conventional IBE apparatus disclosed in Patent Document 1. FIG. 13B is a cross-sectional view of the grid assembly, taken along arrowed line A-A' of FIG. 13A, as seen in a direction of arrows thereof. FIG. 13A illustrates the grid assembly alone, and FIG. 13B illustrates the grid assembly as fixed to the IBE apparatus.

A grid assembly 20 is formed of three grids 21, 22 and 23 each in the shape of a circular plate, and plural openings (not illustrated) of the grids are arranged in an array. Also, the grids 21, 22 and 23 each have eight fixing through-holes 10 arranged on a predetermined circumference. The grid assembly 20 is mounted to a chamber 1 with a mounting platform 40 in between. The mounting platform 40 includes a cap ring 41 and first and second rings 42 and 43. The cap ring 41 is attached to the chamber 1. The grids 21, 22 and 23 are disposed between the first ring 42 and the second ring 43 and are integrally fastened by fixing bolts 28 passing through the through-holes 10. Spacer insulators 29 are disposed to electrically isolate the grids, and spacer insulators 30 are disposed to electrically isolate the grids 21, 22 and 23 from the fixing bolts 28.

The grid assembly 20 is configured so that the positions of the plural openings of the three grids are aligned with one another, and ions accelerated by a potential difference between the grids pass through the aligned openings thereby to allow forming an ion beam having a uniform spatial distribution.

CITATION LIST

Patent Document

Patent Document 1: Japanese Patent Application Laid-Open No. 2011-129270

SUMMARY OF INVENTION

Assembly of the grid assembly illustrated in FIGS. 13A and 13B involves fixing the grids 21, 22, 23 by the bolts 28 through the through-holes 10, while positioning the grids 21, 22, 23 by using the eight through-holes 10, in a state where components are stacked one on top of another. Thus, the assembly is difficult and is also susceptible to manufacturing errors between dimensions of the components (for example since manufacturing errors between the eight through-holes concentrate on the last fixing through-hole). However, a simple reduction in the number of through-holes leads to deterioration in reproducibility for positioning and strength of fixing. When the grid assembly is designed with loose fitting tolerance in order to facilitate the assembly, reproducibility of the assembly deteriorates, which in turn is prone to cause a misalignment between the grids. Meanwhile, when the grid assembly is designed with close fitting tolerance in order to suppress the misalignment between the grids, the assembly becomes difficult. Further, an attempt to forcedly fix the grids may cause deformation in the grids.

When the positions of the openings are not aligned in the grids, a path of an ion beam deviates from a desired path. FIG. 14A is an illustration showing a path of an ion beam in a case where the grids are misaligned parallel to one another. In this case, the path of the ion beam is inclined with respect to a grid surface. FIG. 14B is an illustration showing a path of an ion beam in a case where the grids are deformed. In this case, the path of the ion beam varies from one place to another. Thus, when a misalignment between the grids or deformation in the grids causes a change in the path of the ion beam, the change may lead to deterioration in an in-plane distribution of the amount of ion beam irradiation of a process substrate and hence to an increase in variations in an etching rate at each point in a substrate surface. Alternatively, as a result of the change in the path of the ion beam, a pattern having a desired shape or dimensions may not be formed.

Such problems may become more noticeable as the process substrate becomes larger in diameter. The reason for this is that as the substrate becomes larger in diameter, the grid assembly also needs to become larger in size, and consequently, the amount of position misalignment between the grids also becomes larger.

The present invention has been made in order to solve the foregoing problems. An object of the present invention is to provide a grid assembly which is easy to assemble and is high in assembly reproducibility, and an ion beam etching apparatus including the grid assembly.

According to a first aspect of the present invention, there is provided a grid assembly including: a grid having a positioning hole and a first fixing hole; a fixing member provided with a protrusion portion and a second fixing hole, wherein the protrusion portion is configured to pass through the positioning holes of two or more of the grids stacked one on top of another; and a passing-through member configured to fix together the two or more stacked grids and the fixing member by passing through the first fixing holes and the second fixing hole, wherein the protrusion portion passes through the positioning holes and the protrusion portion, wherein the passing-through member passes through the first fixing holes and the second fixing hole.

The grid assembly according to the present invention is easy to assemble and is high in assembly reproducibility. This allows precise alignment between grids in the positions of openings thereof, thus enabling a uniform spatial distribution of an ion beam. Moreover, a homogeneous ion beam etching process can be performed even in a case where plural apparatuses are provided with the grid assemblies, respectively, having the same configuration, in a case where the grid assembly is temporarily detached for maintenance and is then attached again, or in the like case.

BRIEF DESCRIPTION OF DRAWINGS

FIG. 7A is a view illustrating the arrangement of the positioning holes in the grid assembly according to one embodiment of the present invention.

FIG. 7B is a view illustrating the arrangement of the positioning holes in the grid assembly according to one embodiment of the present invention.

FIG. 8 is a view explaining a positioning method in the grid assembly according to one embodiment of the present invention.

DESCRIPTION OF EMBODIMENTS

Figure 1:
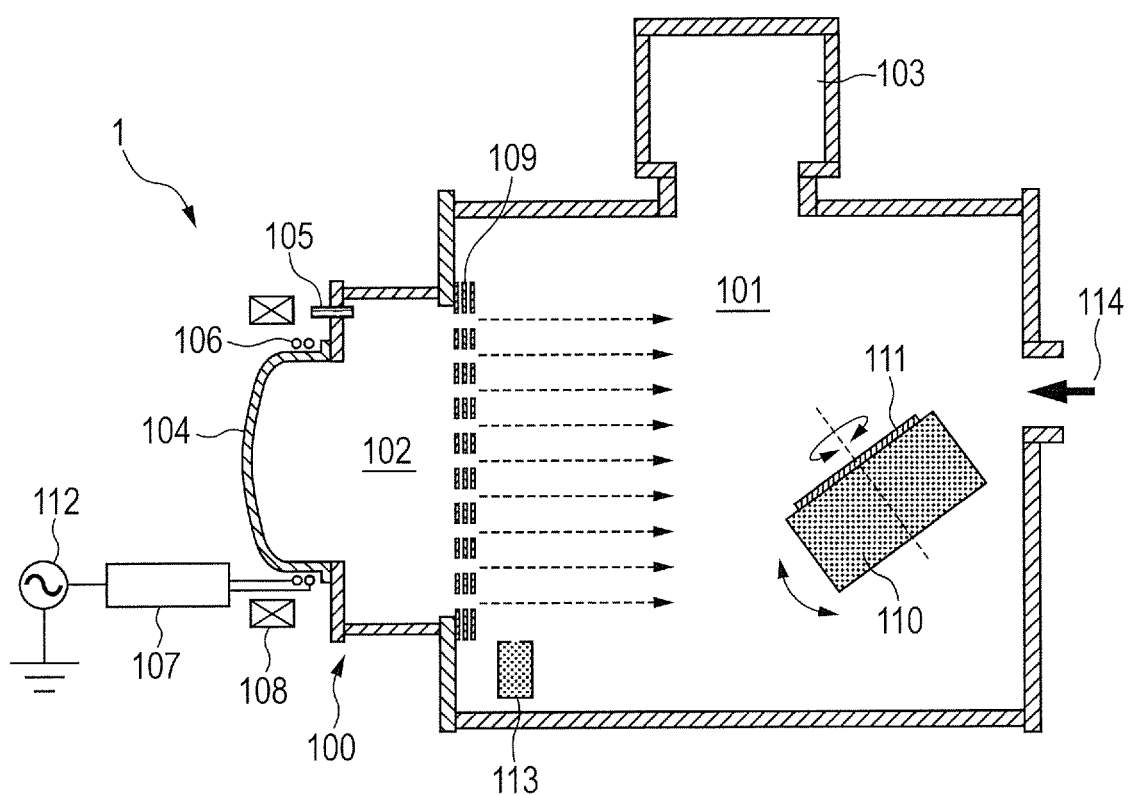
FIG. 1 is a schematic diagram of a configuration of an ion beam etching apparatus according to one embodiment of the present invention.

Although embodiments of the present invention will be described below with reference to the drawings, it is to be understood that the present invention is not limited to the embodiments. In the drawings described below, parts having the same functions are indicated by the same reference numerals, and repeated description of the parts will sometimes be omitted.

First Embodiment

FIG. 1 is a schematic diagram of a configuration of an ion beam etching apparatus 1 according to the embodiment. The ion beam etching apparatus 1 includes a process chamber 101, and an ion beam generation device 100 provided to apply ion beam irradiation into the process chamber 101. In other words, the ion beam generation device 100 is linked to the process chamber 101 so that an ion beam generated from the ion beam generation device 100 is introduced into the process chamber 101.

In the process chamber 101, a substrate holder 110 capable of holding a substrate 111 is provided so that the ion beam emitted from the ion beam generation device 100 is incident on the substrate holder 110. An evacuation pump 103 is also installed in the process chamber 101. A neutralizer 113 is provided in the process chamber 101, and the ion beam introduced from the ion beam generation device 100 can be electrically neutralized by the neutralizer 113. Thereby, the substrate 111 can be irradiated with the electrically neutralized ion beam, and thus, charge-up of the substrate 111 is suppressed. The process chamber 101 is also provided with a gas introduction unit 114, and a process gas can be introduced into the process chamber 101. The substrate holder 110 can be arbitrarily inclined with respect to the ion beam. The substrate holder 110 is also structured to be capable of rotating the substrate 111 in its in-plane direction.

The ion beam generation device 100 includes a plasma generation chamber 102 internally having a discharge space. A portion of the plasma generation chamber 102 is defined by a bell jar 104 as a discharge container. The bell jar 104 is configured to be detachable from the ion beam generation device 100.

The plasma generation chamber 102 is provided with a gas introduction unit 105, and an etching gas is introduced into the plasma generation chamber 102 by the gas introduction unit 105. Also, an RF antenna 106 for generating a radio-frequency (RF) field is arranged around the plasma generation chamber 102 (or the bell jar 104) so as to allow plasma discharge in the plasma generation chamber 102. The RF antenna 106 is connected via a matching device 107 to a radio-frequency power supply 112. Further, an electromagnetic coil 108 for generating a predetermined magnetic field in the plasma generation chamber 102 is provided around the plasma generation chamber 102. In such a configuration, the etching gas is introduced from the gas introduction unit 105, and radio-frequency power is applied to the RF antenna 106, and thereby, plasma of the etching gas can be generated in the plasma generation chamber 102.

The ion beam generation device 100 further includes a grid assembly 109 disposed at a boundary between the process chamber 101 and the plasma generation chamber 102 and configured as an extraction means for extracting ions from the plasma generated in the plasma generation chamber 102. In the embodiment, a DC voltage is applied to the grid assembly 109, the ions in the plasma generation chamber 102 are extracted as a beam, the substrate 111 is irradiated with the extracted ion beam, and thereby, the substrate 111 is subjected to a process.

Figure 2A:
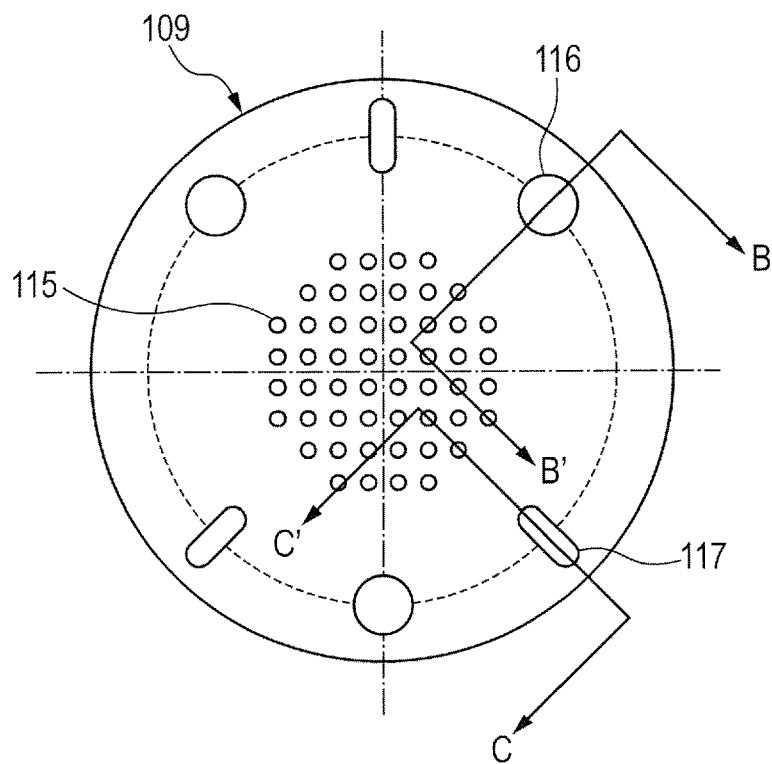
FIG. 2A is a plan view of a grid assembly according to one embodiment of the present invention.

FIG. 2A is a plan view of the grid assembly 109 according to the embodiment, as seen from the plasma generation chamber 102 side. FIG. 2A illustrates grids alone, with fixing bolts or the like omitted. The grid assembly 109 is constructed of three grids each in the shape of a circular plate, which are stacked one on top of another, and the grid assembly 109 has many ion passage holes 115 near its center, intended for passage of ions generated in the plasma generation chamber 102. The grid assembly 109 also includes three fixing holes 116 for fixing the three grids, and three positioning holes 117 for positioning the three grids, and the holes 116, 117 are arranged on a circumference of a circle R which is a predetermined imaginary circle imaginarily set on a surface of the grid assembly 109. The ion passage holes 115, the fixing holes 116 and the positioning holes 117 are provided in the three grids and are arranged so that the positions of the holes are aligned in the three grids.

Figure 3A:
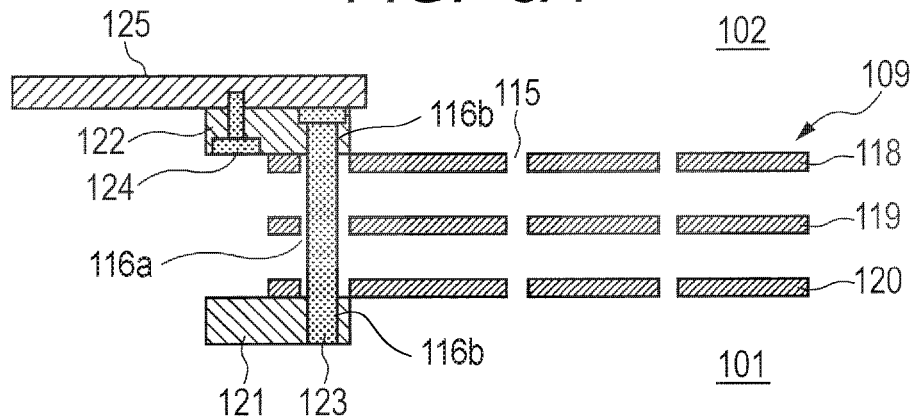
FIG. 3A is a cross-sectional view of the grid assembly according to one embodiment of the present invention.

FIG. 3A is a cross-sectional view of the grid assembly 109 according to the embodiment, taken along arrowed line B-B' of FIG. 2A, as seen in a direction of arrows thereof. The grid assembly 109 includes a first grid 118 (or a plasma-side grid) as an extraction electrode, a second grid 119 as an acceleration electrode, and a third grid 120 (or a substrate-side grid), which are arranged in sequence from the plasma generation chamber 102 side. The grids 118, 119, 120 are electrodes each in the shape of a circular plate, which are made of an electrically conductive material (for example, molybdenum, carbon, or the like). The first grid 118, the second grid 119 and the third grid 120 are arranged so that each of the ion passage holes 115 formed in the first grid 118, each of the ion passage holes 115 formed in the second grid 119, and each of the ion passage holes 115 formed in the third grid 120 overlap one another.

The first grid 118 is connected to a power supply (not illustrated), and a positive voltage is applied to the first grid 118. The second grid 119 is connected to a power supply (not illustrated), and a negative voltage is applied to the second grid 119. Thus, when plasma is generated in the plasma generation chamber 102, the positive voltage is applied to the first grid 118, and the negative voltage is applied to the second grid 119, ions are accelerated by a potential difference between the first grid 118 and the second grid 119. The third grid 120, which is also called a ground electrode, is grounded. A diameter of an ion beam can be controlled within a predetermined range of numerical values by using an electrostatic lens effect by controlling a potential difference between the second grid 119 and the third grid 120.

In a state where the first grid 118, the second grid 119 and the third grid 120 are stacked one on top of another, further, a first ring 121 as a first fixing member is stacked on top of the process chamber 101 side, and a second ring 122 as a second fixing member is stacked on top of the plasma generation chamber 102 side. The rings 121, 122 are ring-shaped members extending along an outer peripheral portion of the grids 118, 119, 120, and are provided with the fixing holes 116b (also called second fixing holes) at positions corresponding to the fixing holes 116a (also called first fixing holes) of the grids 118, 119, 120. In a state where the grids 118, 119, 120 and the rings 121, 122 are arranged so that the fixing holes 116a and 116b thereof overlap one another, the grids and the rings are fixed through the fixing holes 116a and 116b by a bolt 123 as a passing-through member. Further, one end of the bolt 123 is fixed in the fixing hole 116b of the first ring 121, and the other end thereof is fixed in the fixing hole 116b of the second ring 122. Further, spacer insulators (not illustrated) are disposed between the first grid 118 and the second grid 119, between the second grid 119 and the third grid 120, and between the grids and the bolt 123, thereby to provide electrical isolation between the grids.

By such a configuration, the grids 118, 119, 120 and the rings 121, 122 are integrally fixed by the bolt 123. Further, the first ring 121 is fixed to a wall surface 125 by using a screw 124, and thereby, the grid assembly 109 is mounted to the wall surface 125.

The fixing holes 116a provided in the grids 118, 119, 120 are configured to have a larger amount of allowance in all in-plane directions of the grids 118, 119, 120 than dimensions of the bolt 123. In other words, the fixing holes 116a are configured so that the bolt 123 is in no contact with and is spaced from inner walls of the fixing holes 116a in any direction in a state where the bolt 123 is inserted in the fixing holes 116a and in a state where the bolt 123 is located at a center of the fixing holes 116a. Such a configuration enables suppressing the occurrence of a situation where the bolt 123 presses the inner walls of the fixing holes 116a and hence causes deformation in the grids 118, 119, 120, when the sizes of the grids 118, 119, 120 vary due to thermal expansion or the like. Moreover, assembly of the grid assembly 109 is less likely to encounter a situation where the positions of the fixing holes 116a of the grids 118, 119, 120 are not aligned with one another and hence the bolt 123 cannot pass through the fixing holes 116a.

Figure 3B:
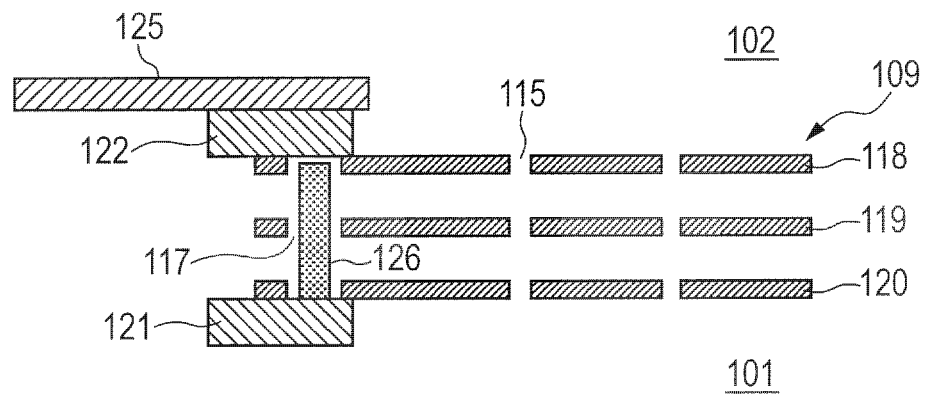
FIG. 3B is a cross-sectional view of the grid assembly according to one embodiment of the present invention.

FIG. 3B is a cross-sectional view of the grid assembly 109 according to the embodiment, taken along arrowed line C-C' of FIG. 2A, as seen in a direction of arrows thereof. The first ring 121 has positioning pins 126 as protrusion portions for use in positioning, at positions corresponding to the positioning holes 117 of the grids 118, 119, 120. In a state where the positioning pins 126 are arranged so that the positioning holes 117 of the grids 118, 119, 120 overlap the positioning pins 126 of the first ring 121, the positioning pins 126 pass through the positioning holes 117.

In the assembly of the grid assembly 109 according to the embodiment, first, the grids 118, 119, 120 on the first ring 121 are stacked one on top of another so that the three positioning pins 126 on the first ring 121 are inserted into the three positioning holes 117 provided in the grids 118, 119, 120. At this time, as described in detail later, positioning is performed at three points to thus facilitate the positioning in particular and improve positioning reproducibility. After such positioning, the second ring 122 is stacked on top of the grids 118, 119, 120, and the bolts are inserted into the three fixing holes 116a provided in the grids 118, 119, 120 and the rings 121, 122, and thereby, the entire grid assembly 109 is fixed. At this time, since the positioning has been performed in advance, it is possible to suppress the occurrence of a situation where, in fixing, the fixing holes 116a are not aligned with one another.

In the embodiment, the positioning pins 126 are provided on the first ring 121; however, the positioning pins 126 may be provided on the second ring 122. In this case, the assembly of the grid assembly 109 may be performed in reverse order to that in a case where the positioning pins 126 are provided on the first ring 121.

Figure 13A:
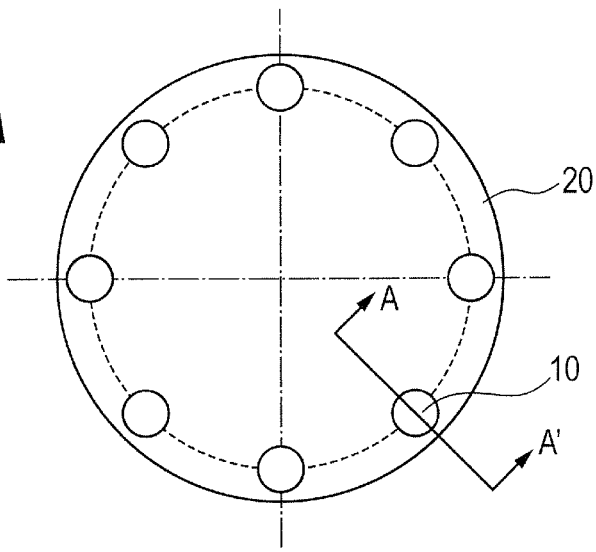
FIG. 13A is a plan view of a conventional grid assembly.
Figure 13B:
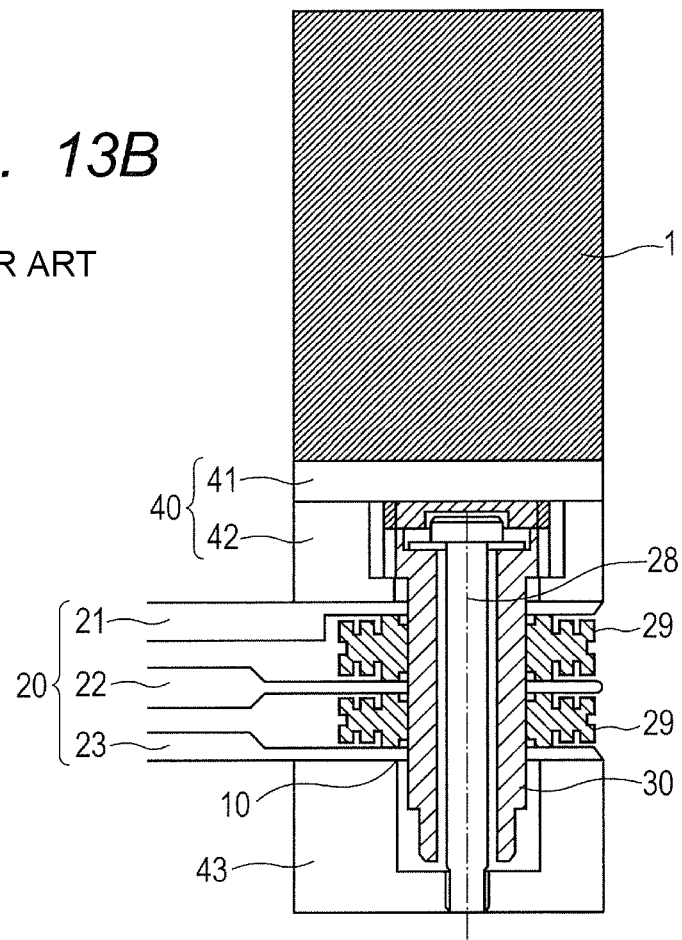
FIG. 13B is a cross-sectional view of the conventional grid assembly.
Figure 14A:
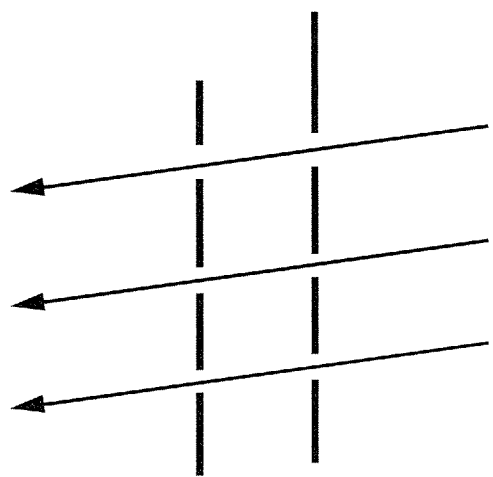
FIG. 14A is an illustration for explaining a path of an ion beam passing through the grids.
Figure 14B:
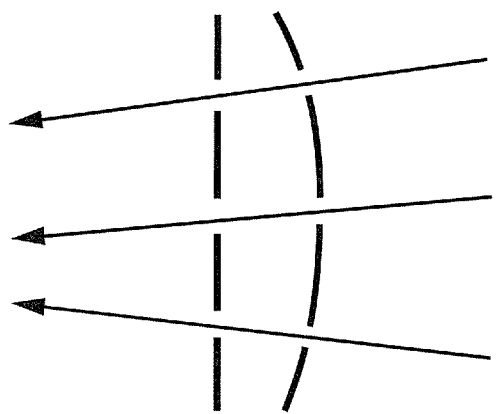
FIG. 14B is an illustration for explaining a path of an ion beam passing through the grids.

The assembly of the conventional grid assembly illustrated in FIGS. 13A and 13B requires simultaneously performing the positioning and the fixing by using the eight through-holes and bolts, and thus, the assembly is difficult. Meanwhile, in the assembly of the grid assembly according to the embodiment, the positioning is first performed by using the positioning holes and the fixed positioning pins (or protrusion portions), and in a state where the positioning has been performed, the fixing can be performed by the fixing holes and the bolts, and thus, the assembly is easy.

The shapes and arrangements of the positioning hole 117 and the positioning pin 126 according to the embodiment are configured to allow positioning the grid assembly 109 in particular with ease and high reproducibility.

Figure 4A:
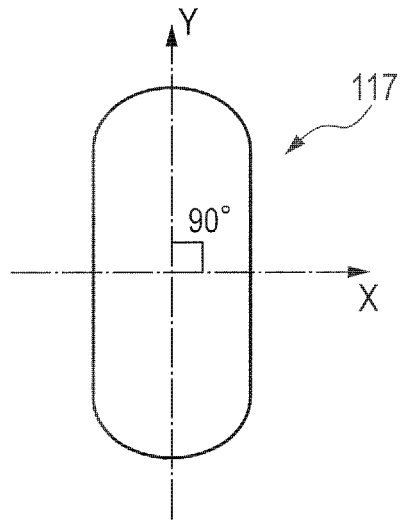
FIG. 4A is a plan view of a positioning hole in the grid assembly according to one embodiment of the present invention.
Figure 4B:
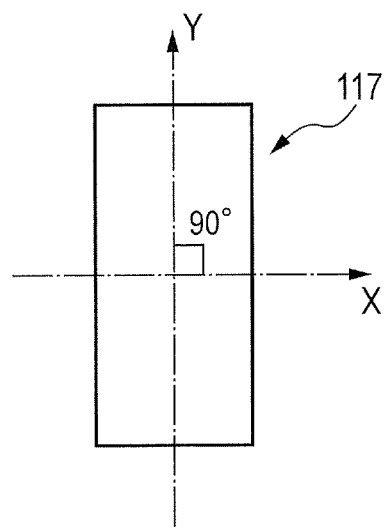
FIG. 4B is a plan view of the positioning hole in the grid assembly according to one embodiment of the present invention.
Figure 4C:
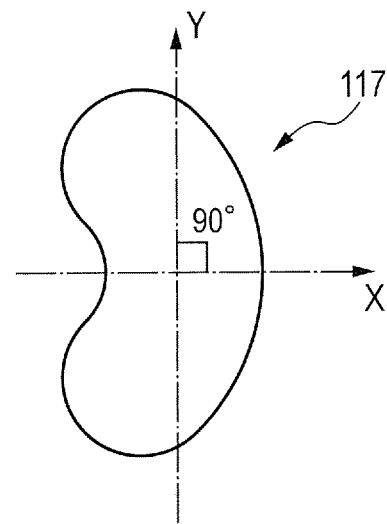
FIG. 4C is a plan view of the positioning hole in the grid assembly according to one embodiment of the present invention.

FIGS. 4A to 4C are plan views illustrating exemplary shapes of the positioning holes 117, as seen in a direction of a normal to the grids 118, 119, 120. The positioning holes 117 illustrated in FIGS. 4A to 4C each have a shape such that a length along a Y-axis direction (also called a lengthwise direction) orthogonal to an X axis is greater than a width along an X-axis direction (also called a widthwise direction). Specifically, the positioning hole 117 illustrated in FIG. 4A has a plan configuration such that two sides opposite to each other in the widthwise direction are in the form of straight lines parallel to each other and the two sides are connected together by curved lines. Also, the positioning hole 117 illustrated in FIG. 4B has a plan configuration such that two sides opposite to each other in the widthwise direction are in the form of straight lines parallel to each other and the two sides are connected together by straight lines. Also, the positioning hole 117 illustrated in FIG. 4C has a plan configuration such that two sides opposite to each other in the widthwise direction are in the form of arcs parallel to each other and the two sides are connected together by curved lines. The positioning hole 117 illustrated in FIG. 4C is such that a first direction as the widthwise direction and a second direction orthogonal to the first direction change continuously at points of the positioning hole 117. The positioning holes 117 are obtained by forming holes in the grids 118, 119, 120 in a thickness direction according to the plan configurations illustrated in FIGS. 4A to 4C.

Figure 2B:
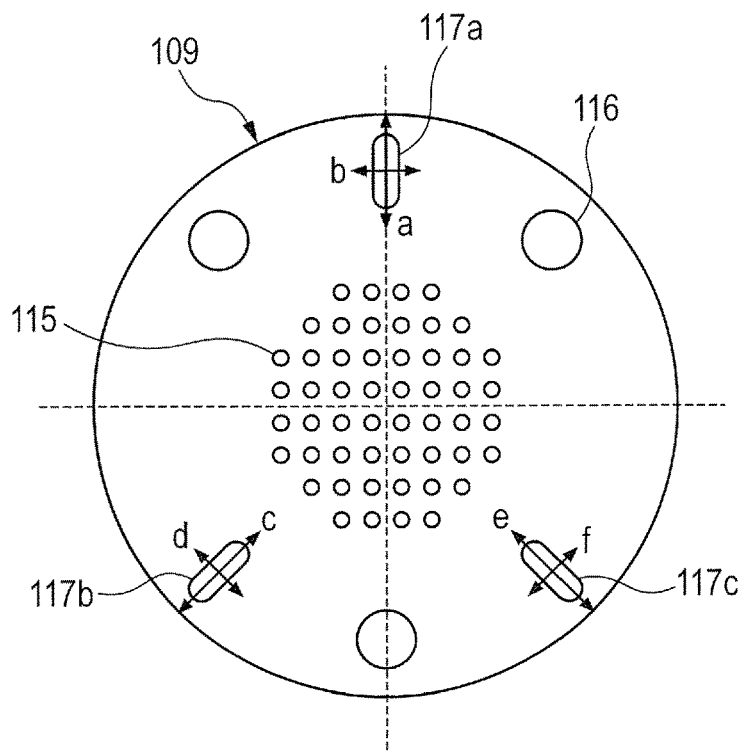
FIG. 2B is a plan view of the grid assembly according to one embodiment of the present invention.

The shape of the positioning hole 117 is not limited to the shapes illustrated in FIGS. 4A to 4C, and any shape may be used, provided that the positioning hole 117 has a predetermined width along the first direction on the surface of the grid and has a length greater than the predetermined width, along the second direction orthogonal to the first direction, on the surface of the grid. The first direction and the second direction may be arbitrarily set in each positioning hole 117. This will be described with reference to FIG. 2B. FIG. 2B is a plan view of the grid assembly 109 as seen from the plasma generation chamber 102 side in the same manner as illustrated in FIG. 2A. In FIG. 2B, a positioning hole 117a is such that a length in a direction a is greater than a width in a direction b. In other words, the direction b is the first direction, and the direction a is the second direction. A positioning hole 117b is such that a length in a direction c is greater than a width in a direction d. In other words, the direction d is the first direction, and the direction c is the second direction. A positioning hole 117c is such that a length in a direction e is greater than a width in a direction f. In other words, the direction f is the first direction, and the direction e is the second direction. Thus, the first direction and the second direction of each positioning hole 117 are set in each positioning hole 117. For the first direction and the second direction of the positioning hole 117b, the direction d may also be called a third direction; and the direction c, a fourth direction, relative to the positioning hole 117a. Likewise, for the first direction and the second direction of the positioning hole 117c, the direction f may also be called a fifth direction; and the direction e, a sixth direction, relative to the positioning hole 117a.

FIGS. 5A to 5D are perspective views illustrating exemplary shapes of the positioning pins 126. In FIGS. 5A to 5D, a Z axis represents a depth direction of the positioning pin 126 as inserted in the positioning hole 117 (or the thickness direction of the grid). The positioning pin 126 illustrated in FIG. 5A has a cylindrical shape. The positioning pin 126 illustrated in FIG. 5B has the shape of a quadratic prism. The positioning pin 126 illustrated in FIG. 5C has a shape such that two faces of a quadratic prism, opposite to each other, are provided with semicylindrical curved surfaces, respectively. The positioning pin 126 illustrated in FIG. 5D has a spherical shape.

Figure 5A:
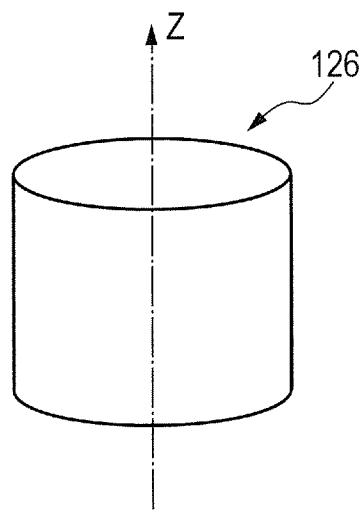
FIG. 5A is a perspective view of a positioning pin in the grid assembly according to one embodiment of the present invention.
Figure 5B:
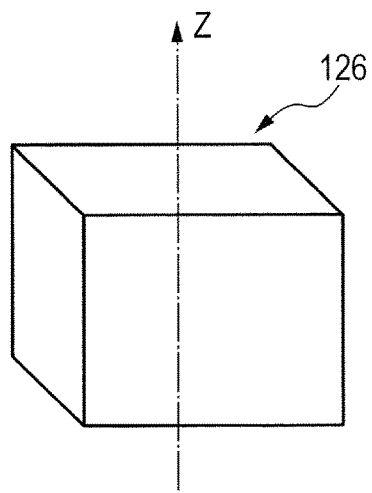
FIG. 5B is a perspective view of the positioning pin in the grid assembly according to one embodiment of the present invention.
Figure 5C:
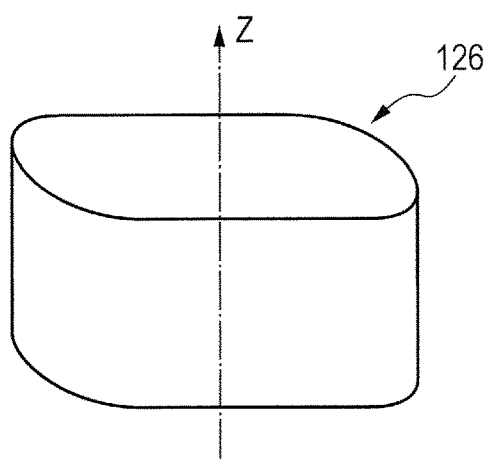
FIG. 5C is a perspective view of the positioning pin in the grid assembly according to one embodiment of the present invention.

When the positioning pin 126 illustrated in FIG. 5B or 5C is passed through the positioning hole 117, relative inclination of the positioning pin 126 with respect to the lengthwise direction of the positioning hole 117 causes a change in a state of contact of the positioning pin 126 with an inner wall of the positioning hole 117. In actual manufacture of the grid assembly 109, however, the amount of position misalignment of the positioning hole 117 and the amount of angular misalignment thereof with respect to the positioning pin 126 are minute. Therefore, the relative inclination of the positioning pin 126 with respect to the lengthwise direction of the positioning hole 117 changes little in the assembly of the grid assembly 109, and thus, advantageous effects of the present invention can be achieved even when the positioning pin 126 illustrated in FIG. 5B or 5C is used.

Any method is used to fix the positioning pin 126 to the first ring 121. For example, a method may be used in which the positioning pin 126 is provided with a screw, the first ring 121 is provided with a threaded hole, and the screw is fitted in the threaded hole to fix the positioning pin 126, or an adhesive, caulking, welding, brazing or the like may be used to fix the positioning pin 126.

The shape of the positioning pin 126 is not limited to the shapes illustrated in FIGS. 5A to 5D, and any shape may be used, provided that two regions of the positioning pin 126, opposite to each other, are capable of point contact or line contact with the inner wall of the positioning hole 117. As employed herein, the term "point contact" indicates that in a state where the positioning pin 126 is inserted in the positioning hole 117, the positioning pin 126 and the inner wall of the positioning hole 117 contact each other at a point. The term "line contact" indicates that in a state where the positioning pin 126 is inserted in the positioning hole 117, the positioning pin 126 and the inner wall of the positioning hole 117 contact each other on a line and a direction of the line is parallel to a depth direction of the positioning hole 117. The contact may not be necessarily a close point contact or line contact, and the positioning pin 126 may be configured as given below: the regions of the positioning pin 126, which contact the inner wall of the positioning hole 117, are subjected to chamfering or the like so that the positioning pin 126 contacts the inner wall of the positioning hole 117 in a small area.

Figure 5D:
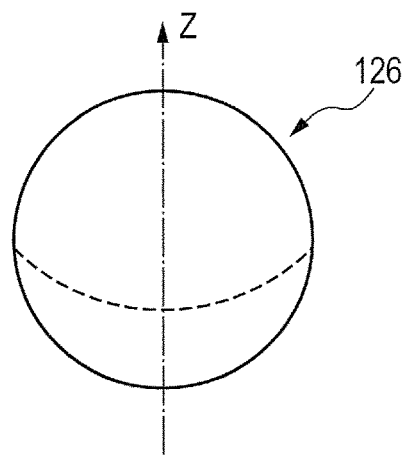
FIG. 5D is a perspective view of the positioning pin in the grid assembly according to one embodiment of the present invention.
Figure 6A:
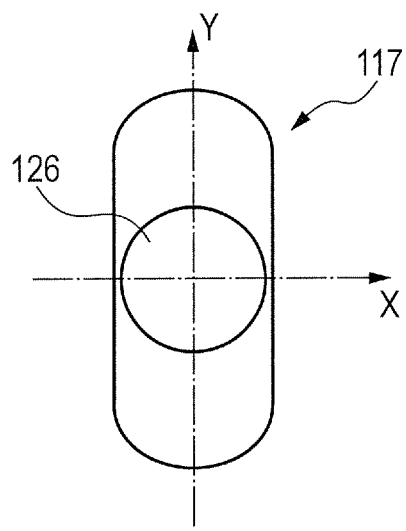
FIG. 6A is a plan view of the positioning pin as inserted in the positioning hole in the grid assembly according to one embodiment of the present invention.
Figure 6B:
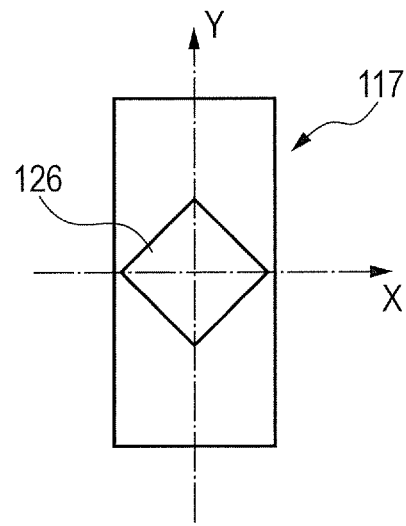
FIG. 6B is a plan view of the positioning pin as inserted in the positioning hole in the grid assembly according to one embodiment of the present invention.
Figure 6C:
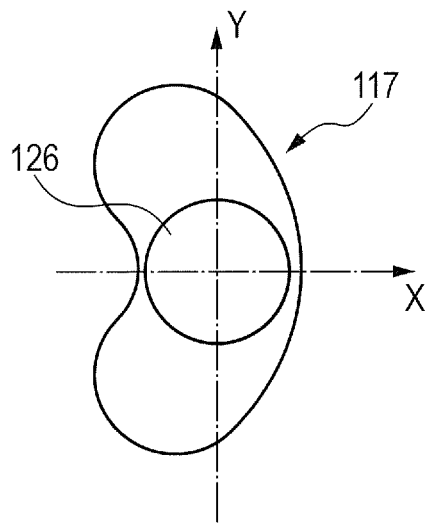
FIG. 6C is a plan view of the positioning pin as inserted in the positioning hole in the grid assembly according to one embodiment of the present invention.

FIGS. 6A to 6C are plan views illustrating exemplary states of the positioning pins 126 as inserted in the positioning holes 117, respectively. FIG. 6A represents a state where the positioning pin 126 having the shape illustrated in FIG. 5A or 5D is inserted in the positioning hole 117 having the shape illustrated in FIG. 4A. FIG. 6B represents a state where the positioning pin 126 having the shape illustrated in FIG. 5B is inserted in the positioning hole 117 having the shape illustrated in FIG. 4B. FIG. 6C represents a state where the positioning pin 126 having the shape illustrated in FIG. 5A or 5D is inserted in the positioning hole 117 having the shape illustrated in FIG. 4C.

The positioning pin 126 is configured so that two regions opposite to each other along the X axis are simultaneously in point contact or line contact with the inner wall of the positioning hole 117 and two regions opposite to each other along the Y-axis direction are not simultaneously in contact with the inner wall of the positioning hole 117. As employed herein, the term "contact" also includes contact in a state where a gap which is such as to allow sliding movement is provided between the positioning pin 126 and the positioning hole 117, besides a close contact of the positioning pin 126 with the positioning hole 117.

In other words, the positioning pin 126 is configured so that in a state where the positioning pin 126 is inserted in the positioning hole 117, the positioning pin 126 cannot move in the first direction with respect to the positioning hole 117 and can slide in the second direction orthogonal to the first direction.

If the actual positioning pin 126 and the actual positioning hole 117 are manufactured in such a manner that the positioning pin 126 cannot move at all in the first direction with respect to the positioning hole 117, tolerances of members render the assembly of the grid assembly 109 difficult. It is therefore desirable that a gap which is at least equivalent to tolerance of fitting of the positioning pin 126 into the positioning hole 117 be provided between the positioning pin 126 and the positioning hole 117 in order to assemble the grid assembly 109. In the present invention, the description "the positioning pin 126 cannot move in the first direction with respect to the positioning hole 117" indicates a state where the positioning pin 126 cannot substantially move with respect to the positioning hole 117, exclusive of the influence of the tolerance of fitting of the positioning pin 126 into the positioning hole 117 for the assembly of the grid assembly 109.

Any combination of the shapes of the positioning hole 117 and the positioning pin 126 may be used, provided that it satisfies the above-mentioned states.

FIGS. 7A and 7B are views illustrating the arrangements of the positioning holes 117 according to the embodiment. As illustrated in FIGS. 7A and 7B, the grids 118, 119, 120 are each provided with the three positioning holes 117 on the circumference of the circle R about a point O. In the embodiment, the three positioning holes 117 are arranged at intervals of 120° about the point O; however, any angle between the three positioning holes 117 may be set. In the embodiment, the three positioning holes 117 are all arranged on the circumference of the circle R about the point O; however, the positioning holes 117 may be arranged along the circumference of the circle R (or equivalently, on circumferences of circles about the point O, having different radii).

As illustrated in FIGS. 7A and 7B, an angle (or a smaller angle) formed by the widthwise direction of the positioning hole 117 (or the X-axis direction in FIGS. 4A to 4C) and a direction of connection of a center of the positioning hole 117 to the center point O of the circle R is set to a predetermined angle which is greater than 0° and is equal to or less than 90°. In the arrangement illustrated in FIG. 7A, the angle is equal to 90°. In the arrangement illustrated in FIG. 7B, the angle is equal to 45°. The angle is configured so that the three positioning holes 117 have an equal angle (or equivalently, the three positioning holes 117 are symmetrical about the center point O of the circle R).

In other words, the direction in which the positioning pin 126 can slide in the positioning hole 117 is configured so as not to be perpendicular to the direction of connection of the center of the positioning hole 117 to the center point O of the circle R.

FIG. 8 is a view of assistance in explaining a positioning method using the three positioning holes 117. In FIG. 8, positioning holes 117d, 117e, 117f are provided on the circle R about the point O on the grids 118, 119, 120, and center points of these positioning holes are indicated by D, E, F, respectively. Also, positioning pins 126d, 126e, 126f are provided on the first ring 121 at positions corresponding to the positioning holes 117d, 117e, 117f.

As mentioned above, the positioning pin is configured so that in a state where the positioning pin is inserted in the positioning hole, the positioning pin can slide in the lengthwise direction of the positioning hole (or the Y-axis direction in FIGS. 4A and 4B). Thus, the positioning pin 126d can slide along a straight line OD in the positioning hole 117d; the positioning pin 126e, along a straight line OE in the positioning hole 117e; and the positioning pin 126f, along a straight line OF in the positioning hole 117f.

First, assuming that the positioning pin 126d is inserted in the positioning hole 117d and the positioning pin 126e is inserted in the positioning hole 117e, the positioning pin 126d slides along the straight line OD and the positioning pin 126e slides along the straight line OE. A locus of the positioning pin 126f involved in such sliding of the positioning pins 126d, 126e is represented by a line Z. Therefore, a point of intersection of the line Z and the straight line OF as the direction in which the positioning pin 126f can slide is the position of the positioning pin 126f. Thus, the positions of the positioning pins 126d, 126e, 126f are naturally uniquely determined to thus allow easy assembly of the grid assembly 109.

Such a configuration enables design of close fitting tolerance. Specifically, according to definition of the fitting tolerance specified by JIS standards and ISO standards, the conventional grid assembly illustrated in FIGS. 13A and 13B requires that the fitting tolerance of the through-hole and the bolt be designed to be loose gap fitting equivalent to Hd, in order to enable fixing at eight points. Meanwhile, in the grid assembly 109 according to the embodiment, the fitting tolerance of the positioning hole 117 and the positioning pin 126 can be designed to be close gap fitting equivalent to Hg. This enables an improvement in reproducibility of the assembly of the grid assembly 109.

Further, the shape and arrangement of the positioning hole 117 and the positioning pin 126 according to the embodiment enable suppressing an adverse influence of thermal expansion during an ion beam process.

In the grid assembly 109 according to the embodiment, as illustrated in FIGS. 7A and 7B, the positioning holes 117 are symmetrically arranged with respect to the center point O of the circle R. When an IBE process is performed, RF discharge increases a temperature in the plasma generation chamber and thus causes thermal expansion in the grid assembly 109. The thermal expansion (and shrinkage when the temperature decreases) occurs isotropically with respect to the center point O, and thus, a displacement of the grid assembly 109 occurs along the direction of connection of the center of each positioning hole 117 to the center point O of the circle R. At this time, as illustrated in FIGS. 7A and 7B, the configuration is such that the positioning pin 126 can slide in one direction of the positioning hole 117 and the direction is not perpendicular to the direction of connection of the center of the positioning hole 117 to the center point O of the circle R, and thus, the positioning pin 126 can be displaced diametrically of the circle R with respect to the center point O. The direction of movement of the positioning pin 126 is limited to one direction, and thus, each grid can be restored to its original position with high reproducibility even if the thermal expansion and shrinkage are repeated. Moreover, the fixing hole 116 is configured to have a larger amount of allowance in all in-plane directions of the grid than the dimensions of the bolt 123, and thus, the bolt 123 can be freely displaced in the fixing hole 116. Therefore, even if the displacement of the grid due to the thermal expansion occurs to some extent, the positioning pin 126 and the bolt 123 do not apply stress to the grid. Alternatively, stress applied can be reduced, and thus, deformation or warpage due to the thermal expansion can be reduced.

Meanwhile, the conventional grid assembly as illustrated in FIGS. 13A and 13B is fixed at the eight points, and the bolt can be displaced in a free direction in each through-hole, and thus, a direction of the thermal expansion and the subsequent shrinkage is irregular. As a result of the thermal expansion and the shrinkage, when the bolt and the grid are located in the through-hole at a position where further displacement is impossible, the bolt applies great stress to the grid during the thermal expansion and the shrinkage, which in turn may cause an increase in warpage or deformation of the grid.

Figure 9A:
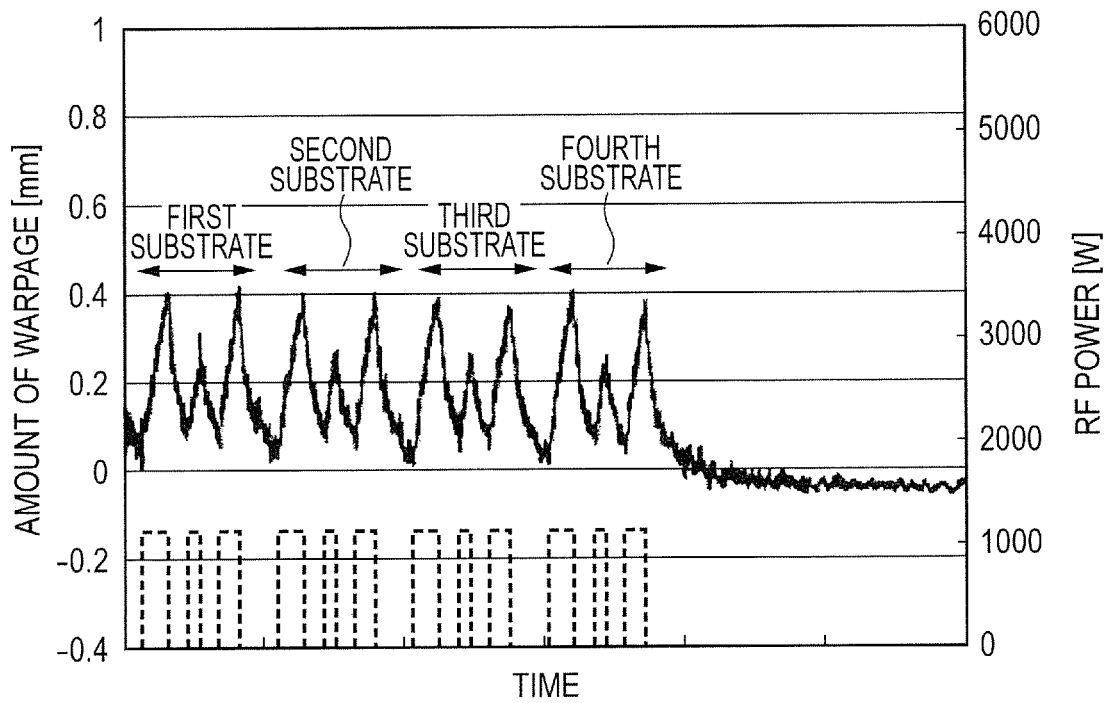
FIG. 9A is a graph showing a change in the amount of warpage in grids with time.
Figure 9B:
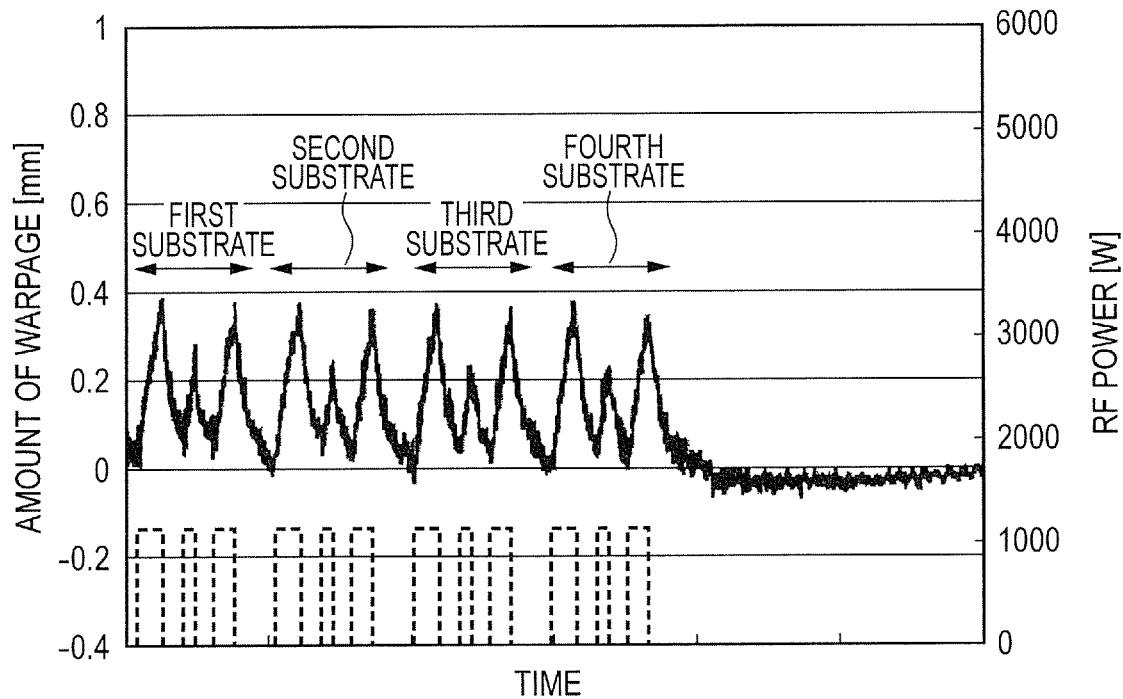
FIG. 9B is a graph showing a change in the amount of warpage in the grids with time.
Figure 9C:
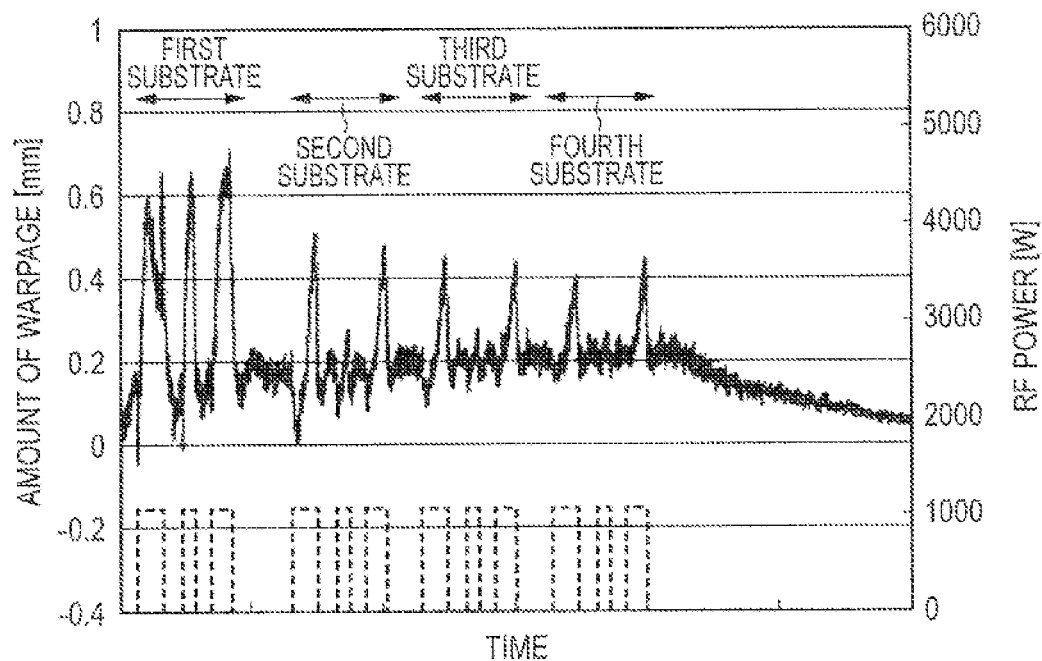
FIG. 9C is a graph showing a change in the amount of warpage in the grids with time.

Experiments were performed for comparison of the amount of warpage during thermal expansion between the embodiment and the conventional technique. FIGS. 9A and 9B are graphs of the amount of warpage in a case where the grid assembly according to the embodiment was used as Example. FIG. 9C is a graph of the amount of warpage in a case where the conventional grid assembly illustrated in FIGS. 13A and 13B was used as Comparative Example. In each of the experiments of FIGS. 9A to 9C, the IBE process was performed in sequence on four process substrates, while the same grid assembly was held. In FIGS. 9A to 9C, solid lines indicate the time-varying amount of warpage in the grids on the plasma generation chamber side (or a maximum value of displacement in the direction of the normal to the grids), and dashed lines indicate RF power applied to the RF antenna. A duration of application of the RF power is a duration of formation of plasma in the plasma generation chamber.

The graphs of FIGS. 9A and 9B show that the amount of warpage remains substantially constant even after the processing of the plural substrates. Meanwhile, the graph of FIG. 9C shows that the amount of warpage is larger than that in the graphs of FIGS. 9A and 9B, and also that the amount of warpage varies greatly from one substrate to another.

The grid assembly used in the experiment of FIG. 9C is fixed at eight points, and the bolt can be displaced in a free direction in each through-hole, and thus, the direction of thermal expansion and shrinkage thereafter does not remain constant. Consequently, it is conceivable that every time the process is performed, the thermal expansion and the shrinkage are repeated in different directions and hence the amount of warpage varies from one process to another. Such variations in the amount of warpage among processes cause deterioration in reproducibility of substrate processing and hence lead to degradation in processing quality.

Meanwhile, the grid assembly according to the embodiment used in the experiments of FIGS. 9A and 9B is configured so that each positioning pin can slide in one direction in each positioning hole, and thus, displacement caused by the thermal expansion and the shrinkage thereafter is limited to a constant direction. Consequently, it is conceivable that the amount of warpage remains stable for each process, which in turn improves the processing reproducibility.

According to the grid assembly according to the embodiment, the positioning pins fixed on the ring are used for positioning and then the bolts are used for fixing, which in turn facilitates the assembly of the grid assembly. Moreover, the three positioning pins are provided and are each configured to be slidable in a specified direction, and thus, the position of each positioning pin is uniquely determined to consequently improve the positioning reproducibility. Further, the positioning pin can slide in the specified direction, and the positioning hole is arranged so that the positioning pin can be displaced in the direction of thermal expansion, which in turn reduces the deformation or warpage during the thermal expansion and also improves the processing reproducibility.

Second Embodiment

In the first embodiment, the configuration is such that the two rings 121, 122 sandwich the grids 118, 119, 120 therebetween, which thus can reduce the likelihood of the grids becoming damaged, even when a break-prone material such as carbon is used for the grids. The positioning pins 126 for positioning are fixed on the first ring 121. However, when a hard material such as molybdenum is used for the grids, the rings are not necessarily required but may be omitted. The second embodiment provides the grid assembly 109 with the rings omitted from the first embodiment, and is otherwise the same as the first embodiment.

Figure 10A:
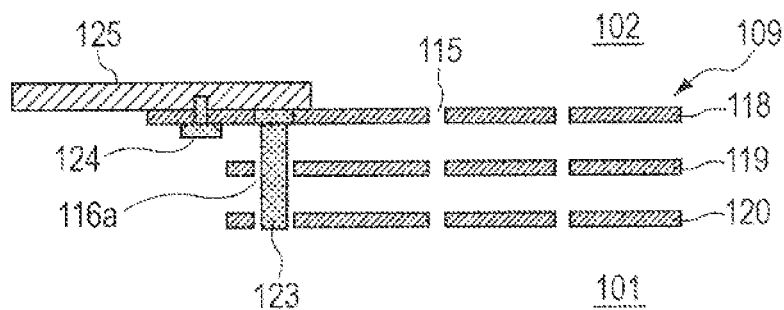
FIG. 10A is a cross-sectional view of the grid assembly according to one embodiment of the present invention.

FIG. 10A is a cross-sectional view of the grid assembly 109 according to the second embodiment, taken along the arrowed line B-B' of FIG. 2A, as seen in the direction of the arrows thereof. In the grid assembly 109 according to the second embodiment, the bolt 123 as the passing-through member directly fixes the grids 118, 119, 120, as distinct from the first embodiment. Moreover, the screw 124 fixes the first grid 118 to the wall surface 125.

Figure 10B:
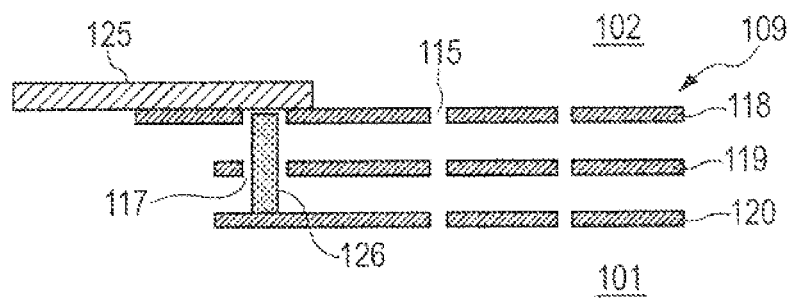
FIG. 10B is a cross-sectional view of the grid assembly according to one embodiment of the present invention.

FIG. 10B is a cross-sectional view of the grid assembly 109 according to the second embodiment, taken along the arrowed line C-C' of FIG. 2A, as seen in the direction of the arrows thereof. The third grid 120 according to the second embodiment has the positioning pins 126 as the protrusion portions at the positions corresponding to the positioning holes 117, rather than the positioning holes 117, as distinct from the first embodiment.

In the assembly of the grid assembly 109 according to the second embodiment, first, the grids 118, 119 are stacked on top of the third grid 120 so that the three positioning pins 126 on the third grid 120 are inserted into the three positioning holes 117 provided in each of the grids 118, 119. After such positioning, the bolts are inserted into the three fixing holes 116a and b provided in each of the grids 118, 119, 120, thereby to fix the entire grid assembly 109. At this time, since the positioning has been performed in advance, it is possible to suppress the occurrence of a situation where, in fixing, the fixing holes 116a and 116b are not aligned with one another.

Any method is used to fix the positioning pin 126 to the third grid 120. For example, a method may be used in which the positioning pin 126 is provided with a screw, the third grid 120 is provided with a threaded hole, and the screw is fitted in the threaded hole to fix the positioning pin 126, or an adhesive may be used to fix the positioning pin 126.

In the second embodiment, the positioning pins 126 are provided on the third grid 120; however, the positioning pins 126 may be provided on the first grid 118. In this case, the assembly of the grid assembly 109 may be performed in reverse order to that in a case where the positioning pins 126 are provided on the third grid 120.

Any of the shapes and arrangements described with reference to FIGS. 4A to 7B with regard to the first embodiment may be used as the shape and arrangement of the positioning hole 117 and the positioning pin 126 and can achieve the same advantageous effects as those of the first embodiment.

Third Embodiment

In the first embodiment, as illustrated in FIGS. 7A and 7B, the configuration is such that the positioning pin 126 can slide in one direction of the positioning hole 117 and the direction is not perpendicular to the direction of connection of the center of the positioning hole 117 to the center point O of the circle R. Thus, the positioning pin 126 can be displaced diametrically of the circle R with respect to the center point O, which in turn enables suppressing the occurrence of a situation where displacement during thermal expansion causes the positioning pin 126 to press the inner wall of the positioning hole 117 and hence cause deformation in the grid. However, when it is not necessary to take the thermal expansion into account, the direction of sliding may be perpendicular to the direction of connection of the center of the positioning hole 117 to the center point O of the circle R. The third embodiment provides the grid assembly 109 which is different from the first embodiment in the arrangement of the positioning holes 117, and the third embodiment is otherwise the same as the first embodiment.

Figure 11:
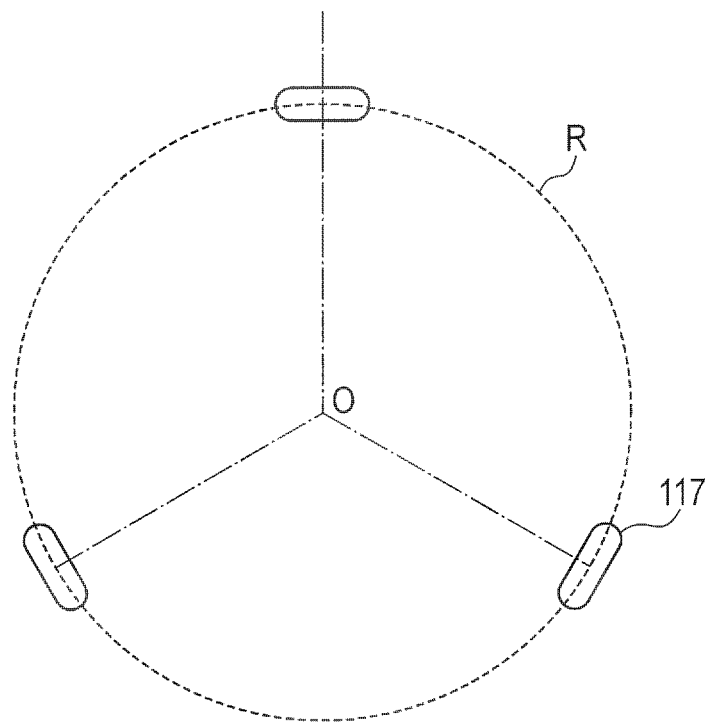
FIG. 11 is a view illustrating the arrangement of the positioning holes in the grid assembly according to one embodiment of the present invention.

FIG. 11 is a view illustrating the arrangement of the positioning holes 117 according to the third embodiment. As illustrated in FIG. 11, the grids 118, 119, 120 are each provided with the three positioning holes 117 on the circumference of the circle R about the point O. In the third embodiment, the three positioning holes 117 are arranged at intervals of 120° about the point O; however, any angle between the three positioning holes 117 may be set. In the third embodiment, the three positioning holes 117 are all arranged on the circumference of the circle R about the point O; however, the positioning holes 117 may be arranged along the circumference of the circle R (or equivalently, on circumferences of circles about the point O, having different radii).

As illustrated in FIG. 11, the angle (or the smaller angle) formed by the widthwise direction of the positioning hole 117 (or the X-axis direction in FIGS. 4A to 4C) and the direction of connection of the center of the positioning hole 117 to the center point O of the circle R is set to 0°. In other words, the direction in which the positioning pin 126 can slide in the positioning hole 117 is perpendicular to the direction of connection of the center of the positioning hole 117 to the center point O of the circle R. The angle is configured so that the three positioning holes 117 have an equal angle (or equivalently, the three positioning holes 117 are symmetrical about the center point O of the circle R).

The grid assembly 109 according to the third embodiment can achieve the same advantageous effects as those of the first embodiment, exclusive of the effect for thermal expansion. In other words, according to the grid assembly according to the third embodiment, the positioning pins fixed on the ring are used for positioning and then the bolts are used for fixing, which in turn facilitates the assembly of the grid assembly. Moreover, the three positioning pins are provided and are each configured to be slidable in a specified direction, and thus, the position of each positioning pin is uniquely determined to consequently improve the positioning reproducibility.

Fourth Embodiment

In the first embodiment, the grids 118, 119, 120 and the rings 121, 122 are integrally fixed by the bolt 123. In such a configuration, when displacements of the grids due to thermal expansion occur, the grids are different in the amount of displacement, and thus, frictional forces exerted between the grids may cause deformation or warpage in the grids. In the fourth embodiment, the bolt 123 as the passing-through member is provided with an additional spring thereby to further reduce the deformation or warpage during the thermal expansion. The fourth embodiment provides the grid assembly 109 which is different from the first embodiment in a fastening structure of the bolt 123, and the fourth embodiment is otherwise the same as the first embodiment.

Figure 12:
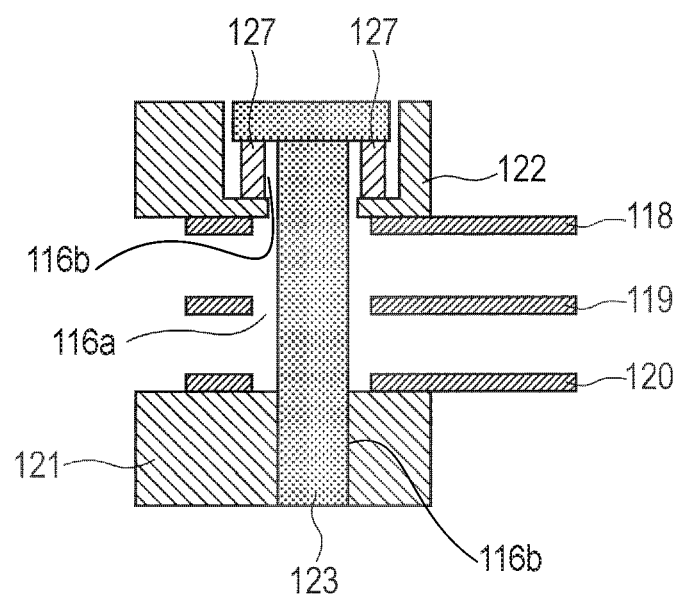
FIG. 12 is a cross-sectional view of the grid assembly according to one embodiment of the present invention.

FIG. 12 is a cross-sectional view of the grid assembly 109 according to the fourth embodiment. In the fourth embodiment, the grid assembly 109 further includes a spring 127 between the bolt 123 and the second ring 122. The spring 127 is a coiled spring disposed in such a way as to surround a stem of the bolt 123, and is disposed in compression between the bolt 123 and the second ring 122. Thus, the spring 127 produces a force in a direction in which the spring 127 in itself expands, or equivalently, in the thickness direction of the grids 118, 119, 120. At this time, the force which the spring 127 applies to the grids 118, 119, 120 in the thickness direction can be set to an appropriate value between 0.5 N and 500 N thereby to reduce the frictional forces exerted between the grids and thus suppress the occurrence of the deformation or warpage during the thermal expansion. The force which the spring 127 applies to the grids 118, 119, 120 in the thickness direction can be adjusted by changing the amount of tightening of the bolt 123.

The spring 127 is not limited to the coiled spring, and any structure may be used, provided that the spring 127 can apply a variable force to the grids 118, 119, 120 in the thickness direction.

According to the grid assembly 109 according to the fourth embodiment, it is possible to reduce the frictional forces exerted between the grids during the thermal expansion and thus suppress the occurrence of the deformation or warpage, as well as enhancing the ease and reproducibility of the assembly.

It should be understood that the present invention is not limited to the above-mentioned embodiments, and various modifications could be made thereto as appropriate without departing from the spirit and scope of the invention.

The invention claimed is:

1. A grid assembly comprising:
two or more grids stacked one on top of another, each grid having three positioning holes and a first fixing hole, the three positioning holes being disposed at equal intervals along a circumference of a predetermined imaginary circle on a surface of each grid;

a fixing member having three protrusion pins and a second fixing hole, the three protrusion pins being configured to pass through the positioning holes of the two or more grids stacked one on top of another; and a passing-through member configured to fix together the two or more stacked grids and the fixing member by passing through the first fixing hole of each of the two or more stacked grids and the second fixing hole, wherein each of the positioning holes has a predetermined width along a first direction on the surface of each grid and has a length greater than the predetermined width, along a second direction orthogonal to the first direction on the surface of each grid, wherein, under a condition of fixing together the two or more stacked grids and the fixing member, first positioning holes of one of the two or more stacked grids overlap with corresponding second positioning holes of another of the two or more stacked grids, wherein the three protrusion pins pass through all of the first positioning holes and all of the second positioning holes, wherein the three protrusion pins are fixed to the fixing member, wherein the passing-through member passes through the first fixing hole of each of the two or more stacked grids and the second fixing hole, and wherein the two or more stacked grids are not mounted on the protrusion pins.

2. The grid assembly according to claim 1, wherein the protrusion pins pass through two or more grids stacked one on top of another.

3. The grid assembly according to claim 1, wherein an angle formed by the first direction and a direction of connection of a center of each of the positioning holes to a center of the predetermined imaginary circle is a predetermined angle which is greater than 0° and is equal to or less than 90°.

4. The grid assembly according to claim 1, wherein the protrusion pins are configured so that the protrusion pins cannot move in a first direction on the surface of each grid with respect to each of the positioning holes and can slide along a second direction orthogonal to the first direction on the surface of each grid.

5. The grid assembly according to claim 1, wherein the passing-through member includes a spring configured to apply a force to the two or more stacked grids in a thickness direction.

6. The grid assembly according to claim 1, wherein each grid further comprises a plurality of ion passage holes, and wherein in a state where the two or more stacked grids and the fixing member are fixed together, each of the plurality of ion passage holes of one of the two or more stacked grids overlaps each of the plurality of ion passage holes of another one of the two or more stacked grids.

7. The grid assembly according to claim 6, wherein the fixing member is a ring-shaped member and is configured to overlap each grid in an outer peripheral portion of the plurality of ion passage holes of each grid.

8. An ion beam etching apparatus comprising:

a plasma generation chamber;

an RF antenna for generating plasma in the plasma generation chamber;

a process chamber linked to the plasma generation chamber;

the grid assembly according to claim 1, for extracting ions from the plasma, from the plasma generation chamber to the process chamber; and a substrate holder provided in the process chamber and capable of holding a substrate, the substrate holder being disposed so that the ions extracted from the grid assembly are incident on the substrate holder.

9. A grid assembly comprising:

two or more grids stacked one on top of another, each grid having three positioning holes and a first fixing hole, the three positioning holes being disposed at equal intervals along a circumference of a predetermined imaginary circle on a surface of each grid;

a fixing member having three protrusion portions and a second fixing hole, the three protrusion portions being configured to pass through the positioning holes of the two or more grids stacked one on top of another; and a passing-through member configured to fix together the two or more stacked grids and the fixing member by passing through the first fixing hole of each of the two or more stacked grids and the second fixing hole, wherein each of the positioning holes has a predetermined width along a first direction on the surface of each grid and has a length greater than the predetermined width, along a second direction orthogonal to the first direction on the surface of each grid, wherein, under a condition of fixing together the two or more stacked grids and the fixing member, first positioning holes of one of the two or more stacked grids overlap with corresponding second positioning holes of another of the two or more stacked grids, wherein the three protrusion portions pass through all of the first positioning holes and all of the second positioning holes, wherein the three protrusion portions are fixed to the fixing member, wherein the passing-through member passes through the first fixing hole of each of the two or more stacked grids and the second fixing hole, and wherein the two or more stacked grids have the same number of positioning holes.

* * * * *